US008154289B2

(12) United States Patent
Zelinski et al.

(10) Patent No.: US 8,154,289 B2
(45) Date of Patent: Apr. 10, 2012

(54) METHOD FOR JOINT SPARSITY-ENFORCED K-SPACE TRAJECTORY AND RADIOFREQUENCY PULSE DESIGN

(75) Inventors: Adam C. Zelinski, Jersey City, NJ (US); Lawrence Wald, Cambridge, MA (US); Elfar Adalsteinsson, Belmont, MA (US); Vivek K Goyal, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 261 days.

(21) Appl. No.: 12/422,512

(22) Filed: Apr. 13, 2009

(65) Prior Publication Data

US 2009/0256570 A1 Oct. 15, 2009

Related U.S. Application Data

(60) Provisional application No. 61/044,102, filed on Apr. 11, 2008.

(51) Int. Cl.
*G01V 3/00* (2006.01)
(52) U.S. Cl. .................. 324/314; 324/307; 324/309
(58) Field of Classification Search .................. 324/314, 324/307, 309
See application file for complete search history.

(56) References Cited

U.S. PATENT DOCUMENTS

| 6,853,192 | B2* | 2/2005 | Heid | 324/314 |
|---|---|---|---|---|
| 7,078,900 | B2* | 7/2006 | Vu | 324/314 |
| 7,141,973 | B2* | 11/2006 | King et al. | 324/314 |
| 2010/0286500 | A1* | 11/2010 | Ruhm | 600/410 |

OTHER PUBLICATIONS

John Pauly et al; A k-Space Analysis of Small Tip Angle Excitation; Journal of Magnetic Resonance 81, 43-56 (1989).
William Grissom et al; Spatial Domain Method for the Design of RF Pulses in Multicoil Parallel Excitation; Magnetic Resonance in Medicine; 56:620-629 (2006).
Chun-Yu Yip et al; Joint Design of Trajectory and RF Pulses for Parallel Excitation; Magnetic Resonance in Medicine 58:596-604 (2007).
Y.S. Levin et al; Trajectory Optimization for Variable-Density Spiral Two-Dimensional Excitation; Proc. Intl. Soc. Mag. Reson. Med. 14 (2006); p. 3012.
B.A. Hargreaves et al; Minimum-Time Multi-Dimensional Gradient Waveform Design Using Convex Optimization; Proc. Intl. Soc. Mag. Reson. Med. 11 (2003); p. 1001.
I. Graesslin et al; While Body 3T MRI System with Eight Parallel RF Transmission Channels; Proc. Intl. Soc. Mag. Reson. Med. 14 (2006); p. 129.
J.L. Ulloa et al; Exploring 3D RF Shimming for Slice Selective Imaging; Proc. Intl. Soc. Mag. Reson. Med. 13 (2005) p. 21.
Yudong Zhu; Parallel Excitation with an Array of Transmit Coils; Magnetic Resonance in Medicine 51:775-784 (2004).

(Continued)

*Primary Examiner* — Louis Arana
(74) *Attorney, Agent, or Firm* — Quarles & Brady LLP

(57) ABSTRACT

A system and method is provided for simultaneously designing a radiofrequency ("RF") pulse waveform and a magnetic field gradient waveform in a magnetic resonance imaging ("MRI") system. The method includes determining a desired pattern of RF excitation and determining, from the desired pattern of RF excitation, a plurality of k-space locations indicative of the magnetic field gradient waveform and a plurality of complex weighting factors indicative of RF energy deposited at each k-space location. The method also includes calculating, from the determined k-space locations, the magnetic field gradient waveform and calculating, from the complex weighting factors, the RF pulse waveform that will produce the desired pattern of RF excitation when produced with the calculated magnetic field gradient.

20 Claims, 5 Drawing Sheets

OTHER PUBLICATIONS

Chun-Yu Yip et al; Iterative RF Pulse Design for Multidimensional, Small-Tip-Angle Selective Excitation; Magnetic Resonance in Medicine 54:908-917 (2005).

Ulrich Katscher et al; Transmit SENSE; Magnetic Resonance in Medicine 49:144-150 (2003).

Kawin Setsompop et al; Parallel RF Transmission With Eight Channel at 3 Tesla; Magnetic Resonance in Medicine 56:1163-1171 (2006).

Suwit Saekho et al; Small Tip Angle Three-Dimensional Tailored Radiofrequency Slab-Select Pulse for Reduced B1 Inhomogeneity at 3 Tesla; Magnetic Resonance in Medicine 53:479-484 (2005).

Suwit Saekho et al; Fast-kz Three-Dimensional Tailored Radiofrequency for Pulse Reduced B1 Inhomogeneity; Magnetic Resonance in Medicine 55:719-724 (2006).

* cited by examiner

METHOD FOR JOINT SPARSITY-ENFORCED K-SPACE TRAJECTORY AND RADIOFREQUENCY PULSE DESIGN

CROSS REFERENCE TO RELATED APPLICATION

This application is based on, claims the priority of, and incorporates by reference U.S. Provisional Patent Application Ser. No. 61/044,102, filed Apr. 11, 2008, and entitled "Method for Joint Sparsity-Enforced k-Space Trajectory and Radiofrequency Pulse Design."

STATEMENT REGARDING FEDERALLY SPONSORED RESEARCH

This invention was made with government support under Grant Nos. R01 EB007942 and EB006847 awarded by the National Institutes of Health. The United States government has certain rights in this invention.

BACKGROUND OF THE INVENTION

The field of the invention is magnetic resonance imaging ("MRI") methods and systems. More particularly, the invention relates to the generation of spatially-tailored excitation pulses for parallel transmission MRI systems.

When a substance such as human tissue is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques.

The measurement cycle used to acquire each MR signal is performed under the direction of a pulse sequence produced by a pulse sequencer. Clinically available MRI systems store a library of such pulse sequences that can be prescribed to meet the needs of many different clinical applications. Research MRI systems include a library of clinically proven pulse sequences and they also enable the development of new pulse sequences.

The MR signals acquired with an MRI system are signal samples of the subject of the examination in Fourier space, or what is often referred to in the art as "k-space". Each MR measurement cycle, or pulse sequence, typically samples a portion of k-space along a sampling trajectory characteristic of that pulse sequence. Most pulse sequences sample k-space in a raster scan-like pattern sometimes referred to as a "spin-warp", a "Fourier", a "rectilinear", or a "Cartesian" scan. The spin-warp scan technique employs a variable amplitude phase encoding magnetic field gradient pulse prior to the acquisition of MR spin-echo signals to phase encode spatial information in the direction of this gradient. In a two-dimensional implementation ("2DFT"), for example, spatial information is encoded in one direction by applying a phase encoding gradient, $G_y$, along that direction, and then a spin-echo signal is acquired in the presence of a readout magnetic field gradient, $G_x$, in a direction orthogonal to the phase encoding direction. The readout gradient present during the spin-echo acquisition encodes spatial information in the orthogonal direction. In a typical 2DFT pulse sequence, the magnitude of the phase encoding gradient pulse, $G_y$, is incremented, $\Delta G_y$, in the sequence of measurement cycles, or "views" that are acquired during the scan to produce a set of k-space MR data from which an entire image can be reconstructed.

There are many other k-space sampling patterns used by MRI systems These include "radial", or "projection reconstruction" scans in which k-space is sampled as a set of radial sampling trajectories extending from the center of k-space. The pulse sequences for a radial scan are characterized by the lack of a phase encoding gradient and the presence of a readout gradient that changes direction from one pulse sequence view to the next. There are also many k-space sampling methods that are closely related to the radial scan and that sample along a curved k-space sampling trajectory rather than the straight line radial trajectory.

An image is reconstructed from the acquired k-space data by transforming the k-space data set to an image space data set. There are many different methods for performing this task and the method used is often determined by the technique used to acquire the k-space data. With a Cartesian grid of k-space data that results from a 2D or 3D spin-warp acquisition, for example, the most common reconstruction method used is an inverse Fourier transformation ("2DFT" or "3DFT") along each of the 2 or 3 axes of the data set. With a radial k-space data set and its variations, the most common reconstruction method includes "regridding" the k-space samples to create a Cartesian grid of k-space samples and then perform a 2DFT or 3DFT on the regridded k-space data set. In the alternative, a radial k-space data set can also be transformed to Radon space by performing a 1DFT of each radial projection view and then transforming the Radon space data set to image space by performing a filtered backprojection.

Depending on the technique used, many MR scans currently used to produce medical images require many minutes to acquire the necessary data. The reduction of this scan time is an important consideration, since reduced scan time increases patient throughput, improves patient comfort, and improves image quality by reducing motion artifacts. Many different strategies have been developed to shorten the scan time.

One such strategy is referred to generally as "parallel imaging". Parallel imaging techniques use spatial information from arrays of RF receiver coils to substitute for the encoding that would otherwise have to be obtained in a sequential fashion using RF pulses and field gradients (such as phase and frequency encoding). Each of the spatially independent receiver coils of the array carries certain spatial information and has a different sensitivity profile. This information is utilized in order to achieve a complete location encoding of the received MR signals by a combination of the simultaneously acquired data received from the separate coils. Specifically, parallel imaging techniques undersample k-space by reducing the number of acquired phase-encoded k-space sampling lines while keeping the maximal extent covered in k-space fixed. The combination of the separate MR signals produced by the separate receiver coils enables a reduction of the acquisition time required for an image (in comparison to conventional k-space data acquisition) by a factor that in the most favorable case equals the number of the receiver coils.

Thus the use of multiple receiver coils acts to multiply imaging speed, without increasing gradient switching rates or RF power.

Most MRI scanners use a single-channel RF excitation coil to tip the spin magnetization away from its equilibrium state and initiate a measurement cycle. Usually, an RF excitation pulse is used to excite either all of the spins inside the excitation coil (non-selective excitation), a single slice through the subject (slice-selective excitation), or within only a specific region, such as, a small cube (3-D spatially-selective excitation). In spatially-selective, spatially-tailored excitation, the RF pulse is played out in the presence of gradient waveforms that impart a gradient onto the main magnetic field of the MRI system, which is instrumental in the spatial and selective excitation process. In general, the gradient field may be viewed as causing the traversal of a curve in excitation k-space, a path that may proceed through all three dimensions of k-space ($k_x$, $k_y$, and $k_z$), which under certain assumptions is essentially a 3D Fourier domain. During this traversal of excitation k-space, the energy of the RF pulse being played in conjunction with the gradient waveforms may be viewed as depositing RF energy along this k-space excitation trajectory curve. The RF pulse thus produces an excitation that modulates (in phase, in amplitude, or both) as a function of position ($k_x$, $k_y$, and $k_z$) in excitation k-space. The resulting excitation is often closely related to the inverse Fourier transform of this deposited energy.

For example, in a typical slice-selective RF pulse, a constant gradient field is applied in the z-direction while an RF pulse shaped like a sine cardinal ("sinc") function is transmitted through the MRI system's single excitation coil. In this instance, the gradient field causes the RF pulse energy to be deposited along a single line (a "spoke") in the $k_z$-direction of excitation k-space, that is, a line through the k-space position $(0,0,k_z)$. This sinc-like deposition in $k_z$ excites only those magnetic spins within a thin slice of tissue due to the Fourier relationship between energy deposited in excitation k-space and the flip angle of the resulting magnetization. In short, the magnetization that results from this typical RF pulse is a constant degree of excitation within the slice and no excitation out of the slice.

Recent work has extended this slice-selective concept to all three spatial dimensions, in which not only a thin slice is excited, but a particular pattern within the slice itself is excited. These "spatially-tailored" excitations in 2D and 3D require lengthy application of the RF excitation and associated gradients. A recent method, termed "parallel transmission" (and sometimes referred to as "parallel excitation"), exploits variations among the different spatial profiles of a multi-element RF coil array. This permits sub-sampling of the gradient trajectory needed to achieve the spatially-tailored excitation and this method has been shown in many cases to dramatically speed up, or shorten, the corresponding RF pulse.

This "acceleration" of the spatially-tailored RF excitation process makes the pulse short enough in duration to be clinically useful. Accelerations of 4 to 6 fold have been achieved via an 8 channel transmit system as disclosed by K. Setsompop, et al., in "Parallel RF Transmission with Eight Channels at 3 Tesla," *Magnetic Resonance in Medicine;* 2006, 56:1163-1171. This acceleration enables several important applications, including flexibly-shaped excitation volumes and mitigation of RF field inhomogeneity at high field for slice or slab-selective pulses. A number of methods have been proposed for the design of the RF and gradient waveforms for parallel excitation, such as those disclosed, for example, by U. Katscher, et al., in "Transmit SENSE," *Magnetic Resonance in Medicine;* 2003, 49:144-150; by Y. Zhu in "Parallel Excitation with an Array of Transmit Coils," *Magnetic Resonance in Medicine;* 2004, 51:775-784; by M. Griswold, et al., in "Autocalibrated Accelerated Parallel Excitation (Transmit-GRAPPA)," *Proceedings of the* 13*th Annual Meeting of ISMRM;* 2005, 2435; and by W. Grissom, et al., in "Spatial Domain Method for the Design of RF Pulses in Multicoil Parallel Excitation," *Magnetic Resonance in Medicine;* 2006, 56:620-629.

Successful implementations have been demonstrated on multi-channel hardware, including those described by P. Ullmann, et al., in "Experimental Analysis of Parallel Excitation Using Dedicated Coil Setups and Simultaneous RF Transmission on Multiple Channels," *Magnetic Resonance in Medicine;* 2005, 54:994-1001; by D. Xu, et al., in "A Noniterative Method to Design Large-Tip-Angle Multidimensional Spatially-Selective Radio Frequency Pulses for Parallel Transmission," *Magnetic Resonance in Medicine;* 2007, 58:326-334; and by P. Vernickel, et al., in "Eight-Channel Transmit/Receive Body MRI Coil at 3 T," *Magnetic Resonance in Medicine;* 2007, 58:381-389.

In conventional pulse design, a general excitation format is selected, such as a slice-selective excitation, and a standard set of gradients and a radiofrequency ("RF") pulse are chosen to accomplish the desired effect. For example, and as mentioned above, a constant gradient field is applied in the z-direction while an RF pulse shaped like a sine cardinal ("sinc") function is transmitted through the MRI system's single excitation coil to excite a thin slice of tissue along the spatial z-direction. Cases such as this are one of the simplest examples of pulse design. An extension of this example is where an excitation k-space trajectory is selected first. For example, if a highly structured two-dimensional ("2D") pattern needs to be excited, the MRI operator may choose a set of gradient waveforms that cause a 2D pattern echo-planar or spiral trajectory to be traversed in excitation space ($k_x,k_y$). Exemplary patterns of such k-space trajectories are shown in FIGS. 1A and 1B, respectively.

If a parallel transmission system is available, the trajectory may be "accelerated" by undersampling it and using, for example, a shorter echo-planar or spiral sampling trajectory. Only after deciding upon the excitation k-space trajectory and gradients does the MRI operator proceed to design an RF pulse to accompany and deposit energy along the trajectory. In other words, the RF pulse is automatically optimized based on the desired target excitation pattern, but the excitation k-space trajectory is not.

Recently, researchers have begun to branch away from the conventional design approaches discussed above and have developed methods that attempt to jointly design both the excitation k-space trajectory and the RF excitation pulse, while optimizing both concurrently. These methods are similar in that they provide a desired target excitation pattern and then, in some manner, search over numerous trajectories, or types of trajectories. In this manner, they proceed to find a "trajectory-pulse" pair that produces a version of the trajectory and resulting excitation that satisfy some predefined constraints on the excitation. Exemplary constraints include a particular excitation k-space trajectory duration (for example, 5 milliseconds) and a particular RF excitation field fidelity (for example, a normalized root-mean-square error of 20 percent).

One current method for the joint design of an excitation k-space trajectory and corresponding RF excitation pulse is the 2D spiral trajectory optimization method described by Y. S. Levin, et al., in "Trajectory Optimization For Variable-Density Spiral Two-Dimensional Excitation," *Proc. Int. Soc.* for *Magn. Reson. Med. (ISMRM)*, 2006; 3012. This method focuses on optimizing 2D spiral trajectories, and is therefore limited in at least three ways. First, the method can only optimize over a specific class of spiral trajectories that consists of concentric rings. Second, the method and its underlying theory apply only to 2D radially-symmetric excitation patterns. Lastly, the method is limited to optimizing over 2D k-space and thus does not apply to often desirable three-dimensional ("3D") excitations. The latter two limitations are hindering because they imply that the method is incapable of being used to excite many commonly-desired spatially-tailored patterns, such as a 2D square, a 3D box, or a thin slice. Additionally, the method provided by Levin is not applicable to parallel transmission coil arrays, but is instead limited to conventional systems.

Another current method for the joint design of an excitation k-space trajectory and corresponding RF excitation pulse is the echo-planar trajectory optimization method described by C. Y. Yip, et al., in "Joint Design of Trajectory and RF Pulses for Parallel Excitation," *Magn. Reson. Med.*, 2007; 58(3): 598-604. This method focuses solely on the optimization of 2D echo-planar trajectories. Unlike the aforementioned method of Levin, this method is applicable to a general 2D excitation pattern and, therefore, radial symmetry of the desired excitation pattern is no longer a strict requirement. However, this technique is limited in that it optimizes only 2D echo-planar trajectories, and it thus limited in its application. First, it cannot be used to excite commonly-used 3D patterns, such as thin slices. Second, traversing echo-planar trajectories can result in lengthy, impractical durations of time because echo-planar traversals are limited by the maximum amplitude and slew rates of the gradient system of the MRI system. Also, when 2D echo-planar trajectories and waveforms are applied in the presence of inhomogeneities in the MRI system, they may cause the produced excitation to exhibit worse artifacts than other excitation patterns.

It would therefore be desirable to provide a method for the joint calculation of an excitation k-space trajectory and corresponding RF excitation pulse that is applicable to any arbitrary trajectory shape, including one-, two-, and three-dimensional trajectories. In addition, it would be desirable for such a method to be applicable not only to conventional MRI systems, but also to those that employ parallel transmission RF coils.

SUMMARY OF THE INVENTION

The present invention overcomes the aforementioned drawbacks and limitations of existing methods for the joint calculation of an excitation k-space trajectory and corresponding radiofrequency ("RF") pulse by employing a sparsity-enforcement method that jointly determines sparse, quickly-traversable excitation k-space trajectories along with corresponding excitation pulses and gradient waveforms. More specifically, a desired (for example, 3-D spatially-tailored and/or 3-D spatially-selective) excitation pattern is specified and a customized set of gradients and RF excitation pulses explicitly optimized for the task at hand are generated.

The method functions by applying an $L_1$-norm penalty while searching over a large number of possible trajectory and RF pulse segments using a convex optimization technique. This process reveals a small, sparse subset of these segments, along with an RF pulse, that alone form a high-fidelity version of any desired user-specified RF excitation field. The method is general enough such that these segments may be of any shape or size, which means that the proposed technique is applicable to a wide variety of excitation k-space trajectories and is useful in optimizing any type of excitation pulse.

It is an aspect of the invention to provide users with intuitive, easy to use control parameters that allow excitation quality to be traded off directly with pulse duration. An aspect of the current invention is to automatically generate target-specific excitation k-space trajectories (and corresponding sets of gradient waveforms and RF pulses) that outperform standard trajectories by reducing overall pulse duration, improving the fidelity of the achieved excitation, or both. This method frees MR RF excitation pulse designers from the task of trajectory and pulse design and improves the applicability and performance of emerging parallel transmission systems as well as conventional single transmit channel systems.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

GENERAL DESCRIPTION OF THE INVENTION

Figure 1A:
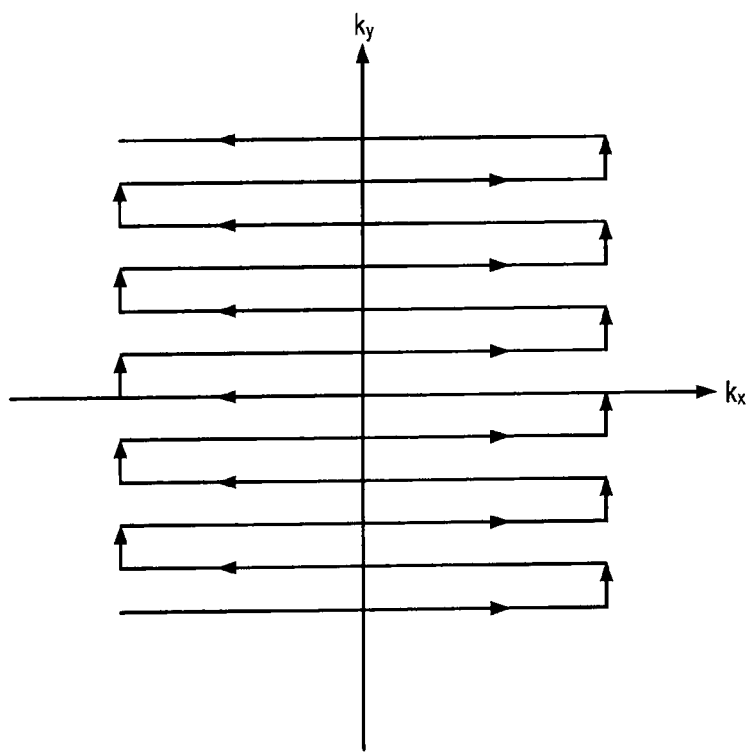
FIG. 1A is a graphic representation of an exemplary echo-planar k-space sampling trajectory.
Figure 1B:
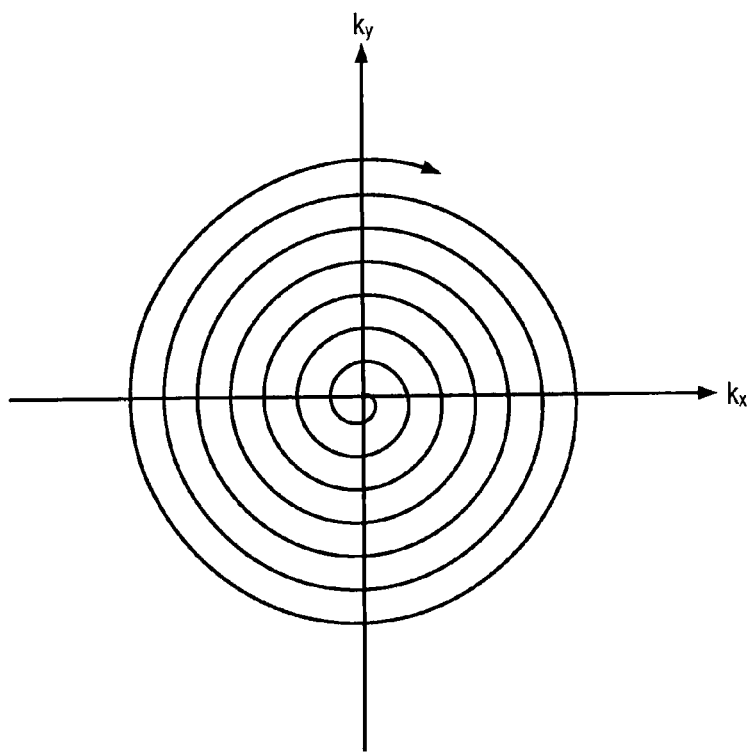
FIG. 1B is a graphic representation of an exemplary spiral

The following definitions and terms are provided to clarify the description of the present invention and to guide those of ordinary skill in the art in the practice of the present invention:

$r=[r_x,r_y,r_z]^T$ is a spatial location;

$G(t)=[G_x(t),G_y(t),G_z(t)]^T$ is a set of gradient waveforms $G_x(t)$, $G_y(t)$, and $G_z(t)$; and $k(t)=[k_x(t),k_y(t),k_z(t)]^T$ is a k-space trajectory.

Parallel excitation systems differ from their single-channel counterparts in that the parallel excitation systems include multiple radiofrequency ("RF") excitation channels that are each capable of independent and simultaneous RF transmission. The presence of multiple RF transmission channels provides the ability to undersample excitation k-space trajectories, yet still produce high quality excitations. Furthermore, undersampling allows for the production of quickly traversable k-space excitation trajectories, which in turn produce corresponding RF pulses with decreased duration. It can therefore be shown how to design a set of P RF pulses that are applied in a parallel excitation system having P transmission channels. The present invention may be employed for a conventional single RF transmit channel MRI system or a multi-channel transmission MRI system. The multiple-transmit channel method will be described herein, as it will be appreciated by those skilled in the art that the extension of this method to a single-channel system can be made by setting P=1.

In one embodiment of the present invention, the smallest subset of contours in k-space and the corresponding RF pulse are determined, such that when the RF pulse is played out along the k-space trajectory defined by the subset of contours a desired RF excitation is achieved. Consider J contours in excitation k-space; these may be 1D spoke segments (e.g., in the $k_z$-direction), rings or other 2D trajectories (e.g., in the $k_x,k_y$ plane), or completely arbitrary curves or other 3D trajectories tracing through k-space. Let the contours be denoted as $c_j(k)$ for $j=1, \ldots, J$. Now assume that for $j=1, \ldots, J$, we know $N_j$ points in k-space along contour $c_j$, denoted $k_{j,1}, \ldots k_{j,N_j}$. Thus, overall, $N_k=N_1+ \ldots +N_J$ discrete k-space points are known.

To begin, a small-tip-angle approximation is employed to create an approximate Fourier relationship between the energy deposited in k-space and the resulting excitation:

$$m(r) = i\gamma M_0 \sum_{p=1}^{P} S_p(r) \int_0^L b_{1,p}(t) e^{i\Delta B_0(r)(t-L)} e^{ir \cdot k(t)} dt; \quad \text{Eqn. (1)}$$

where $\gamma$ the gyromagnetic ratio, $M_0$ is the steady-state magnetization, $m(r)$ is the approximate transverse magnetization resulting from the transmission of the RF pulses, $S_p(r)$ is the complex-valued $B_1^+$ transmit profile of the $p^{th}$ coil, $b_{1,p}(t)$ is the RF pulse played along the $p^{th}$ coil, $\Delta B_0(r)$ is a field map of $B_0$ inhomogeneity, $e^{i\Delta B_0(r)(t-L)}$ is the phase accumulation resulting from the $B_0$ inhomogeneity, L is the RF pulse duration, and $$k(t) = -\gamma \int_t^L G(\tau)d\tau.$$

Eqn. (1) can be discretized in space and time to yield:

$$m = S_1 F b_1 + \ldots + S_P F b_P \quad \text{Eqn. (2);}$$

which can alternatively be expressed as:

$$m = [S_1 F \ldots S_P F] \begin{bmatrix} b_1 \\ \vdots \\ b_P \end{bmatrix} = A_{tot} b_{tot}; \quad \text{Eqn. (3)}$$

where $S_p$ is a diagonal matrix containing $N_s$ samples of the $p^{th}$ spatial profile within a user-selected field-of-excitation ("FOX") and $b_p$ includes samples of the $p^{th}$ RF waveform, $b_{1,p}(t)$. Additionally, the matrix, F, incorporates the effects of the $B_0$ inhomogeneity and relates the energy deposited along a contour in k-space to the corresponding spatial location at the $N_s$ sample points where each coil is sampled. Formally:

$$F=i\gamma M_0 \Delta_t e^{i\Delta B_0(r)(t-L)} e^{ir \cdot k(t)} \quad \text{Eqn. (4);}$$

where $\Delta_t$ is the time-sample spacing of the RF waveform, $b_{1,p}(t)$, which is chosen by the user and digital-to-analog hardware parameters of the MR system's RF amplifier.

As mentioned above, in order to excite a desired RF excitation pattern, d(r), with a parallel transmission system having P channels, P RF pulses are employed. By way of example, the desired RF excitation pattern, d(r), can be expressed as an image having pixel intensity values that correspond to the relative level of RF excitation to be applied to a spatial location corresponding to the pixel location. To determine the k-space trajectory that, when employed, produces the desired RF excitation pattern, d(r), the following relationship is formed:

$$d=F_{tot}g_{tot} \quad \text{Eqn. (5);}$$

where d contains $N_s$ samples of the desired RF excitation pattern, d(r), $F_{tot}=[F_1 \ldots F_J]$, and $g_{tot}=[g_1 \ldots g_P]$ is similar to $b_{tot}$ and describes the a complex-valued weighting of a k-space location. The sparse approximation of minimizing $\|g_{tot}\|_0$, subject to $\|d-F\hat{g}\|_2 \leq \epsilon$ is then sought, where $\epsilon$ s a residual error term. Here, $\|\ldots\|_0$ is the so-called $L_0$-norm, which indicates the number of non-zero elements of a vector. While Eqn. (5) can be solved directly via pseudoinversion techniques, the preferred method is to enforce simultaneous sparsity through a minimization of the form:

$$\min_{g^{(l2)}} \{(1-\lambda)\|d-SF_{tot}g_{tot}\|_2^2 + \lambda\|g^{(l2)}\|_1\} \quad \text{Eqn. (6);}$$

where $\lambda$ is a control parameter that balances the trade-offs between residual errors and sparsity, and $\|g^{(l2)}\|_1$ is the $L_1$ norm of the $L_2$-norms of $g_{tot}$ having the form:

$$\|g^{(l2)}\|_1 = \sum_{n=1}^{N} \sqrt{\sum_{p=1}^{P} |g_{n,p}|^2}; \quad \text{Eqn. (7)}$$

where $g_{n,p}$ is a weighting factor indicative of the weighting that the $p^{th}$ transmit channel places at the $n^{th}$ sample of a given k-space contour. Such a norm encourages sparsity of contour use. As $\lambda$ is increased from 0 to 1, increasing numbers of contours have their energies driven to zero, while residual error increases and smaller contour subsets are revealed. When the number of contour samples in k-space is reasonable, finding a small contour subset by solving Eqn. (6) takes only several minutes by first converting the equation into a Second-Order Cone program and then using, for example, the Matlab optimization toolbox (The Mathworks Inc., Natick, Mass.) to solve Eqn. (6). After solving Eqn. (6) for a fixed $\lambda$, an optimized contour subset is formed, containing the "Q" contours having the largest $\|g_{tot}\|_2$. The contour segments in the small subset reveal and suggest a sparse, quickly-traversable k-space trajectory, and the corresponding energy segments provide the RF pulse. Once this sparse contour subset is known, the individual "Q" contours within it are connected using a so-called greedy method. In other words, a short-duration k-space trajectory is identified from a small subset of candidate trajectory segments and then produced by connecting the segments. This yields a fully-determined k-space trajectory and an accompanying RF pulse that is obtained jointly and optimized with respect to the desired RF excitation pattern.

Knowing the trajectory, a set of gradient waveforms, $G(t)=[G_x(t),G_y(t),G_z(t)]^T$, can be generated. Subsequently, the time-dependent k-space trajectory, $k(t)=[k_x(t),k_y(t),k_z(t)]^T$, which is a linear function of G(t), is determined.

Finally, the RF pulse waveform is determined by first truncating $F_{tot}$ and $g_{tot}$ and then least-squares fitting to $\|d-m\|_2$ to determine an updated $g_{tot}$ and hence a retuned g(t). The truncation step eliminates the "(J−Q)" unused contour matrices from $F_{tot}$ as well as the unused contour energy weightings from $g_{tot}$. This step produces a slightly higher-quality version of the excitation and takes merely several seconds by solving $d=F_{tot,trunc}g_{tot,trunc}$ using a conjugate-gradient technique such as "LSQR" described, for example, by C. C. Paige and M. A. Saunders in, "An Algorithm for Sparse Linear Equations and Sparse Least Squares," *ACM Transactions on Mathematical Software* 8(1): 43-71, 1982.

In addition to Eqn. (6) above, other objective functions can be employed to enforce simultaneous sparsity. For example, the following objective function may also be minimized:

$$f_1(\|d-SF_{tot}g_{tot}\|)+f_2(\|g^{(m)}\|) \qquad \text{Eqn. (8);}$$

where $f_1$ and $f_2$ are non-decreasing functions, $\|\ldots\|$ is a norm, and $g^{(m)}$ is a vector having values equal to the $L_m$-norms of the rows of $g_{tot}$. Exemplary functions, $f_1$ and $f_2$, can be any of a class of non-decreasing functions such as monotonically increasing functions. Exemplary norms include $L_0$, $L_1$, $L_2$, and maximum norms.

DETAILED DESCRIPTION OF THE INVENTION

Figure 2:
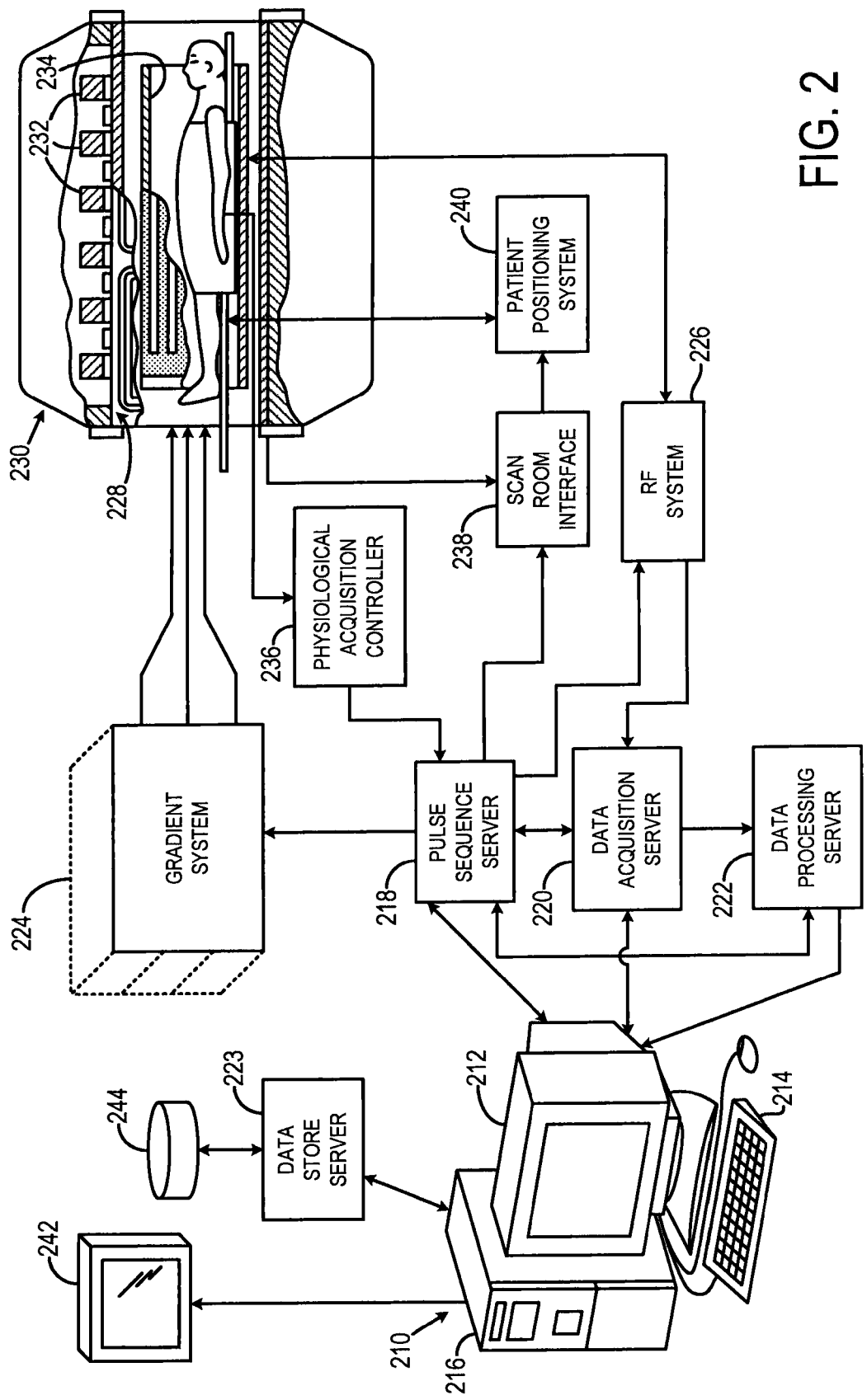
FIG. 2 is a block diagram of an MRI system which employs the present invention.

Referring particularly to FIG. 2, the preferred embodiment of the invention is employed in an MRI system. The MRI system includes a workstation 210 having a display 212 and a keyboard 214. The workstation 210 includes a processor 216 that is a commercially available programmable machine running a commercially available operating system. The workstation 210 provides the operator interface that enables scan prescriptions to be entered into the MRI system. The workstation 210 is coupled to four servers: a pulse sequence server 218; a data acquisition server 220; a data processing server 222, and a data store server 223. The workstation 210 and each server 218, 220, 222 and 223 are connected to communicate with each other.

The pulse sequence server 218 functions in response to instructions downloaded from the workstation 210 to operate a gradient system 224 and an RF system 226. Gradient waveforms necessary to perform the prescribed scan are produced and applied to the gradient system 224 that excites gradient coils in an assembly 228 to produce the magnetic field gradients $G_x$, $G_y$, and $G_z$ used for position encoding MR signals. The gradient coil assembly 228 forms part of a magnet assembly 230 that includes a polarizing magnet 232 and a whole-body RF coil 234.

RF excitation waveforms are applied to the RF coil 234 by the RF system 226 to perform the prescribed magnetic resonance pulse sequence. Responsive MR signals detected by the RF coil 234 or a separate local coil (not shown in FIG. 2) are received by the RF system 226, amplified, demodulated, filtered and digitized under direction of commands produced by the pulse sequence server 218. The RF system 226 includes an RF transmitter for producing a wide variety of RF pulses used in MR pulse sequences. The RF transmitter is responsive to the scan prescription and direction from the pulse sequence server 218 to produce RF pulses of the desired frequency, phase and pulse amplitude waveform. The generated RF pulses may be applied to the whole body RF coil 234 or to one or more local coils or coil arrays (not shown in FIG. 2).

The RF system 226 also includes one or more RF receiver channels. Each RF receiver channel includes an RF amplifier that amplifies the MR signal received by the coil to which it is connected and a detector that detects and digitizes the I and Q quadrature components of the received MR signal. The magnitude of the received MR signal may thus be determined at any sampled point by the square root of the sum of the squares of the I and Q components:

$$M=\sqrt{I^2+Q^2} \qquad \text{Eqn. (9);}$$

and the phase of the received MR signal may also be determined:

$$\phi = \tan^{-1}\left(\frac{Q}{I}\right). \qquad \text{Eqn. (10)}$$

The pulse sequence server 218 also optionally receives patient data from a physiological acquisition controller 236. The controller 236 receives signals from a number of different sensors connected to the patient, such as ECG signals from electrodes or respiratory signals from a bellows. Such signals are typically used by the pulse sequence server 218 to synchronize, or "gate", the performance of the scan with the subject's respiration or heart beat.

The pulse sequence server 218 also connects to a scan room interface circuit 238 that receives signals from various sensors associated with the condition of the patient and the magnet system. It is also through the scan room interface circuit 238 that a patient positioning system 240 receives commands to move the patient to desired positions during the scan.

The digitized MR signal samples produced by the RF system 226 are received by the data acquisition server 220. The data acquisition server 220 operates in response to instructions downloaded from the workstation 210 to receive the real-time MR data and provide buffer storage such that no data is lost by data overrun. In some scans the data acquisition server 220 does little more than pass the acquired MR data to the data processor server 222. However, in scans that require information derived from acquired MR data to control the further performance of the scan, the data acquisition server 220 is programmed to produce such information and convey it to the pulse sequence server 218. For example, during prescans MR data is acquired and used to calibrate the pulse sequence performed by the pulse sequence server 218. Also, navigator signals may be acquired during a scan and used to adjust RF or gradient system operating parameters or to control the view order in which k-space is sampled. And, the data acquisition server 220 may be employed to process MR signals used to detect the arrival of contrast agent in a magnetic resonance angiography (MRA) scan. In all these examples the data acquisition server 220 acquires MR data and processes it in real-time to produce information that is used to control the scan.

The data processing server 222 receives MR data from the data acquisition server 220 and processes it in accordance with instructions downloaded from the workstation 210. Such processing may include, for example: Fourier transformation of raw k-space MR data to produce two or three-dimensional images; the application of filters to a reconstructed image; the performance of a backprojection image reconstruction of acquired MR data; the calculation of functional MR images; the calculation of motion or flow images, etc.

Images reconstructed by the data processing server 222 are conveyed back to the workstation 210 where they are stored. Real-time images are stored in a data base memory cache (not shown) from which they may be output to operator display 212 or a display 242 that is located near the magnet assembly 230 for use by attending physicians. Batch mode images or selected real time images are stored in a host database on disc storage 244. When such images have been reconstructed and transferred to storage, the data processing server 222 notifies the data store server 223 on the workstation 210. The workstation 210 may be used by an operator to archive the images, produce films, or send the images via a network to other facilities.

Figure 3:
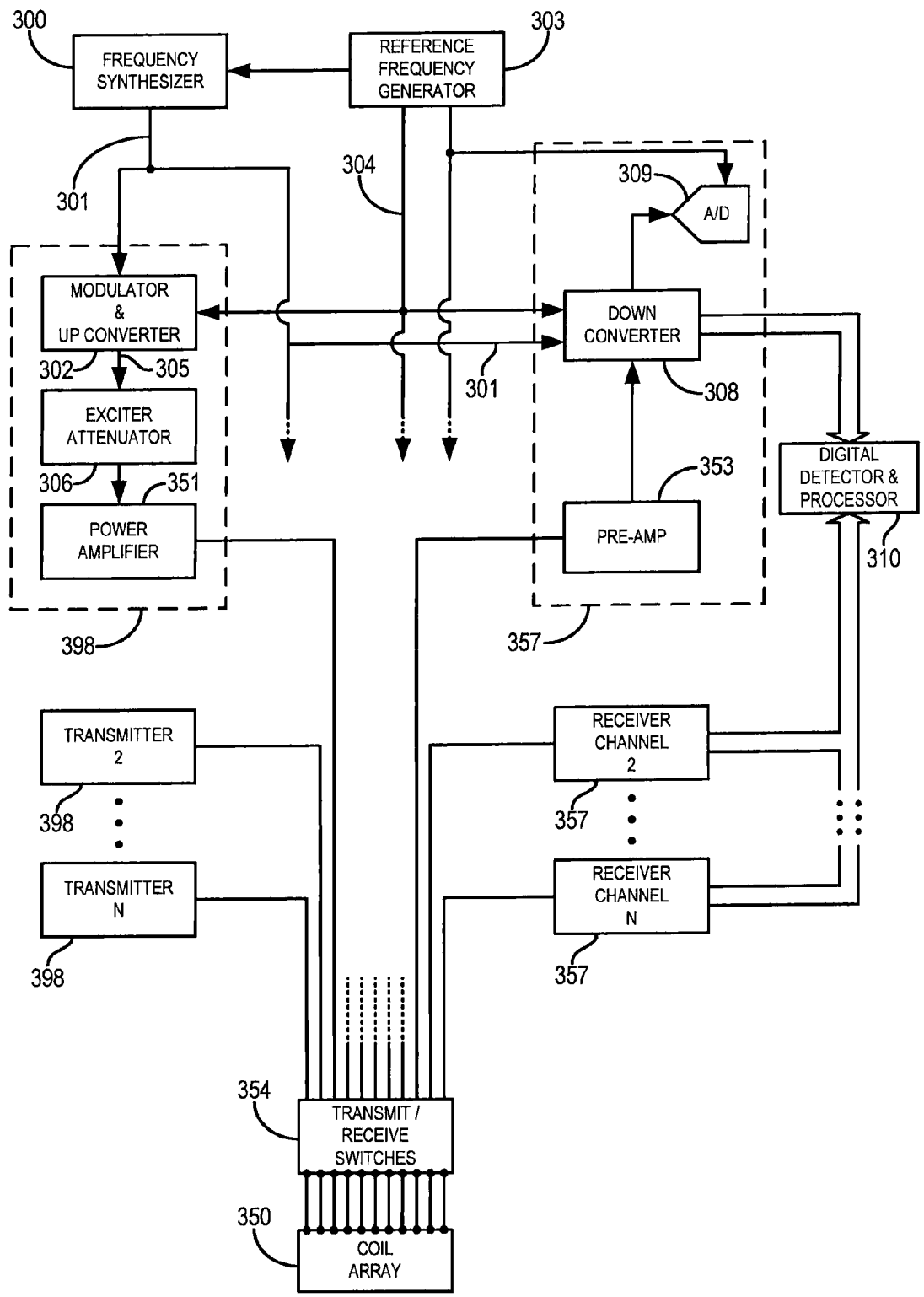
FIG. 3 is a block diagram of an RF system that forms part of the MRI system of FIG. 2.

Referring particularly to FIG. 3, the present invention employs a coil array 350 that includes a plurality of coil elements that can be separately driven by a plurality of RF transmitters to produce the prescribed radiofrequency ("RF") field of excitation ("FOX"). The same coil array 350 can also be used with a plurality of receive channels, or in the alternative, the whole body RF coil 234 or a local RF coil can be used to acquire the MR signals. Many different coil array structures 350 may be used with the present invention, which maps the $B_1^+$ RF excitation field produced by each coil array element.

Referring particularly to FIG. 3, the RF system 226 includes a set of transmitters 398 that each produce a prescribed RF excitation field. The base, or carrier, frequency of this RF excitation field is produced under control of a frequency synthesizer 300 which receives a set of digital signals from the pulse sequence server 218. These digital signals indicate the frequency and phase of the RF carrier signal produced at an output 301. The RF carrier is applied to a modulator and up converter 302 in each transmitter 398 where its amplitude is modulated in response to a signal also received from the pulse sequence server 218. The signal defines the envelope of the RF excitation pulse to be produced and is produced by sequentially reading out a series of stored digital values. These stored digital values may be changed to enable any desired RF pulse envelope to be produced by each transmitter 398.

The magnitude of the RF excitation pulse produced at output 305 is attenuated by an exciter attenuator circuit 306 in each transmitter 398 which receives a digital command from the pulse sequence server 218. The attenuated RF excitation pulses are applied to a power amplifier 351 in each transmitter 398. The power amplifiers are current source devices that connect to respective transmit inputs on a set of transmit/receive switches 354. By way of example, N transmitters 398 are employed and connected through N transmit/receive switches 354 to N coil elements in an RF coil array 350.

Referring still to FIG. 3 the signal produced by the subject is picked up by the coil array 350 and applied to the inputs of a set of receive channels 357. A pre-amplifier 353 in each receiver channel 357 amplifies the signal by an amount determined by a digital attenuation signal received from the pulse sequence server 218. The received signal is at or around the Larmor frequency, and this high frequency signal is down converted in a two step process by a down converter 308 which first mixes the NMR signal with the carrier signal on line 301 and then mixes the resulting difference signal with a reference signal on line 304. The down converter NMR signal is applied to the input of an analog-to-digital (ND) converter 309 which samples and digitizes the analog signal and applies it to a digital detector and signal processor 310 which produces 16-bit in-phase (I) values and 16-bit quadrature (Q) values corresponding to the received signal. The resulting stream of digitized I and Q values of the received signal are output to the data acquisition server 220. The reference signal as well as the sampling signal applied to the ND converter 309 are produced by a reference frequency generator 303.

The transmit/receive switches 354 are operated by the pulse sequence server 218 to connect the N transmitters 398 to the N coil elements in the coil array 350 during those parts of the pulse sequence in which an RF field is to be produced. Each transmitter 398 is separately controlled by the pulse sequence server 218 to produce an RF field of a prescribed amplitude, frequency, phase and envelope at each of the N coil elements. The combined RF fields of the N coil elements produce the prescribed $B_1$ field throughout the region of interest in the subject during the imaging phase of the procedure.

When the $B_1$ field is not produced the pulse sequence server 218 operates the transmit/receive switches 354 to connect each of the N receive channels 357 to the respective N coil elements. Signals produced by excited spins in the subject are picked up and separately processed as described above.

Figure 4:
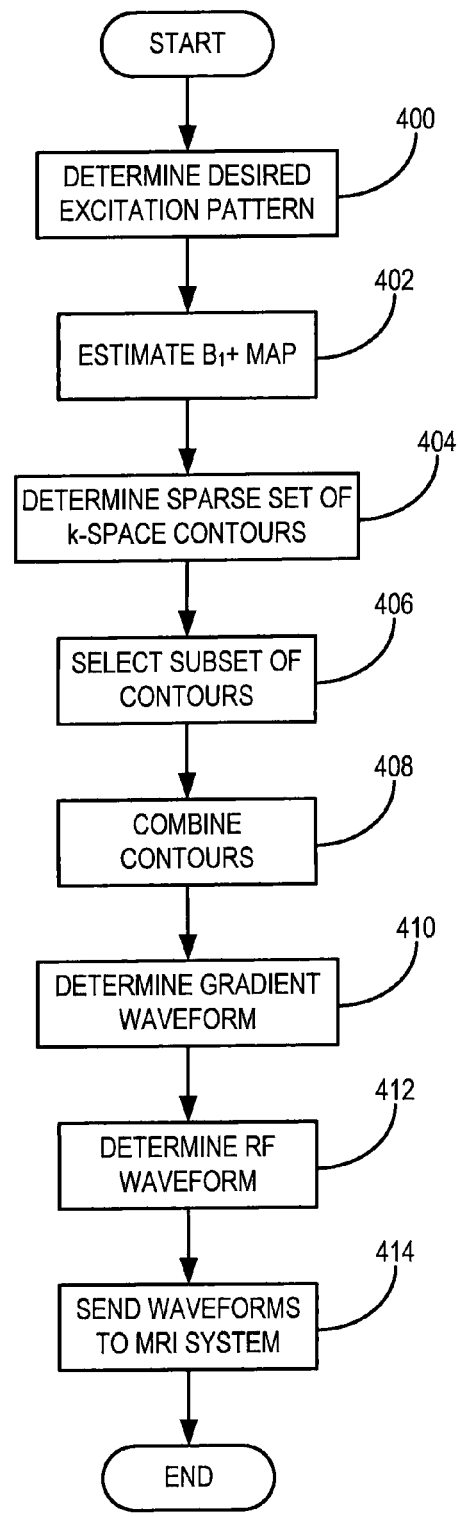
FIG. 4 is a flowchart of a preferred embodiment of the invention.

Referring particularly to FIG. 4, the joint determination of sparsity-enforced k-space trajectories and RF excitation pulses begins by determining a desired RF excitation pattern, as indicated in step 400. This desired excitation pattern is represented, for example, by a grayscale image having pixel intensity values corresponding to the level of RF excitation desired for a given region. Alternatively, the desired pattern of RF excitation can be viewed as a desired pattern of transverse magnetization to be established in a subject. Subsequent to the determination of the desired RF excitation pattern, the transmission characteristics of the RF coil are identified by estimating $B_1^+$ maps for the coil, as indicated at step 402. The $B_1^+$ map is indicative of the spatial sensitivity of the RF coil when transmitting RF energy.

Using the desired RF excitation pattern and $B_1^+$ maps, k-space locations that define a trajectory in k-space are determined through the simultaneous sparsity enforced minimization presented in Eqn. (6) above, as indicated in step 404. As described above, these k-space locations can represent 1D, 2D, or 3D trajectories in k-space. Next, a subset of k-space locations is selected from the determined locations, as indicated at step 406. The subset is chosen, for example, such that a given number of k-space locations having the largest $L_2$-norms are kept. For example, if the k-space locations define a series of contours in k-space, then the set of "Q" k-space locations having the largest $L_2$-norms are utilized to form the subset. In this example, the "Q" k-space locations define a subset of contours in k-space.

This subset of contours is subsequently combined using a greedy method to produce a complete and traversable k-space trajectory, as indicated at step 408. As described above, the k-space locations need not define contours in k-space, and when they do not, the individual k-space locations are still connected using, for example, a greedy method to establish a traversable k-space trajectory. Using the complete k-space trajectory, a gradient waveform that defines the k-space trajectory is determined, as indicated at step 410. This determination is made using the linear relationship between k-space and magnetic field gradients described above. Namely:

$$k(t) = -\gamma \int_t^L G(\tau)d\tau. \qquad \text{Eqn. (11)}$$

The subset of k-space locations determined in step 406 is also utilized to calculate an RF excitation pulse waveform that yields the desired excitation pattern when played along the k-space trajectory determined in step 408, as indicated at step 412. In addition to determining the k-space trajectory, the process of solving Eqn. (6) produces the set of contour matrices, $F_{tot}$, and energy weightings, $g_{tot}$. These matrices are subsequently truncated, as described above, and then fit to $\|d-m\|_2$ using a least-squares method. This process eliminates the unused contour matrices from $F_{tot}$ as well as the unused contour energy weightings from $g_{tot}$ so that a more robust version of the RF excitation waveform is produced. Subsequently, the RF and gradient waveforms are sent to the MRI system, as indicated in step 414. Here, the waveforms are utilized to produce an RF excitation pulse and magnetic field gradient that, when played out substantially contemporaneously, result in the production of an RF excitation field indicative of the desired excitation pattern.

Figure 5A:
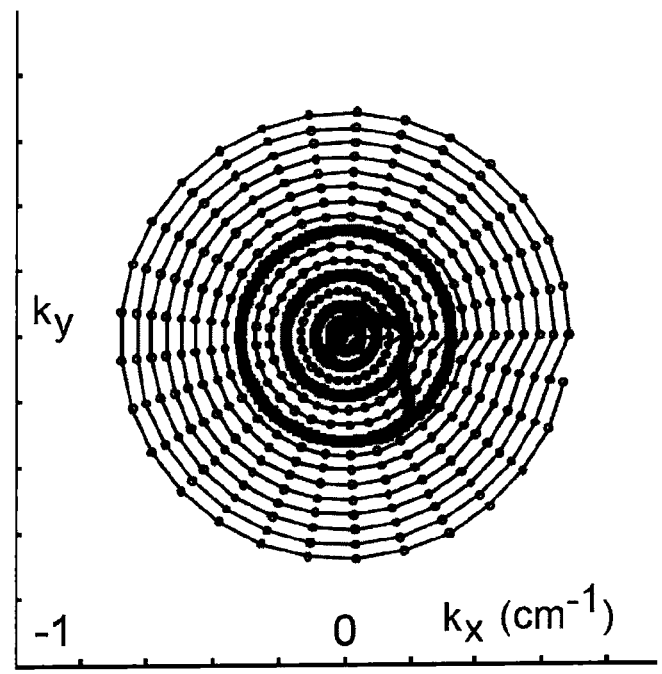
FIG. 5A is an illustration of k-space contours constructed from candidate rings in accordance with the present invention.
Figure 5B:
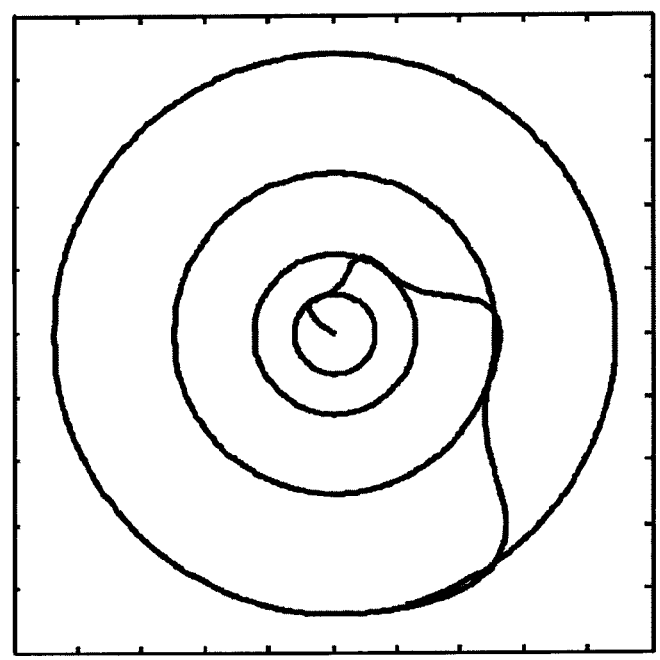
FIG. 5B is a graphic illustration of four rings connected via a greedy method to form a traversable k-space trajectory.

By way of example, a sparsity-enforced spiral trajectory and RF pulse are designed by first defining the set of contours in k-space from which the sparse trajectory subset is sought. FIG. 5A shows 16 contours constructed from 15 candidate rings, each ring containing 25 k-space points along with a single point in the center of k-space ($k_x$=0, $k_y$=0). This set of contours is provided to the method of the present invention along with a desired pattern of RF excitation and a map of the $B_1^+$ profile of the RF coil. By setting $\lambda$=0.30 and solving Eqn. (6) above, four rings are retained as the sparsity-enforced subset. These four rings are connected via a greedy method to form a quickly traversable k-space trajectory, as is shown in FIG. 5B. Also by solving Eqn. (6) above, an RF excitation pulse waveform is determined. Together, the RF excitation pulse waveform and the magnetic field gradient waveform corresponding to the k-space trajectory shown in FIG. 5B can be utilized to produce an RF excitation field indicative of the desired pattern of RF excitation.

The present invention has been described in terms of one or more preferred embodiments, and it should be appreciated that many equivalents, alternatives, variations, and modifications, aside from those expressly stated, are possible and within the scope of the invention. For example, the present invention can also be employed to determine a series of k-space "spokes" instead of a k-space trajectory.

The invention claimed is:

1. A method for producing a radiofrequency (RF) excitation field with an RF coil that forms a part of a magnetic resonance imaging (MRI) system, the steps comprising:
    a) determining a desired pattern of RF excitation;
    b) calculating, using the desired pattern of RF excitation, a plurality of weighting factors related to an RF waveform and a plurality of k-space locations related to a magnetic field gradient waveform, wherein the calculation enforces joint sparsity in the plurality of k-space locations and the plurality of weighting factors;
    c) calculating, from the calculated plurality of k-space locations, the magnetic field gradient waveform;
    d) calculating, using the calculated plurality of weighting factors, an RF pulse waveform indicative of the desired pattern of RF excitation;
    e) producing, with the MRI system, a magnetic field gradient using the magnetic field gradient waveform calculated in step c); and
    f) producing, with the MRI system, an RF pulse using the RF pulse waveform calculated in step d) such that an RF excitation field is produced.

2. The method as recited in claim 1 in which the plurality of k-space locations and the plurality of weighting factors are calculated contemporaneously.

3. The method as recited in claim 1 in which the MRI system includes a parallel transmission RF coil.

4. The method as recited in claim 3 in which step d) includes determining an RF waveform for each channel in the parallel transmission RF coil.

5. The method as recited in claim 4 in which step f) includes producing each RF waveform calculated in step d) with the corresponding channel in the parallel transmission RF coil.

6. The method as recited in claim 1 in which steps e) and f) are performed substantially contemporaneously so that an RF excitation field indicative of the desired pattern of RF excitation is produced.

7. The method as recited in claim 1 in which step b) is performed by minimizing an objective function having the form:

$$f_1(\|d - SF_{tot}g_{tot}\|) + f_2(\|g^{(m)}\|);$$

wherein:
    $f_1$ and $f_2$ are non-decreasing functions;
    $\|\ldots\|$ is a norm operation;
    d is the desired pattern RF excitation;
    S is a sensitivity profile of a RF coil that makes a part of the MRI system;
    $F_{tot}$ is a matrix that relates the energy deposited at a k-space location to a corresponding spatial location on the RF coil;
    $g_{tot}$ is a matrix containing the plurality of weighting factors indicative of the sparse set of k-space locations; and
    $g^{(m)}$ is a vector having values equal to the $L_m$-norms of the rows of $g_{tot}$.

8. The method as recited in claim 1 in which step b) is performed by minimizing an objective function having the form:

$$(1 - \lambda)\|d - SF_{tot}g_{tot}\|_2^2 + \lambda\|g^{(l2)}\|_1;$$

wherein:
    $\lambda$ is a control parameter;
    $\|\ldots\|$ is a norm operation;
    d is the desired pattern RF excitation;
    S is a sensitivity profile of a RF coil that makes a part of the MRI system;
    $F_{tot}$ is a matrix that relates the energy deposited at a k-space location to a corresponding spatial location on the RF coil;
    $g_{tot}$ is a matrix containing the plurality of weighting factors indicative of the sparse set of k-space locations; and
    $g^{(l2)}$ is a vector having values equal to the $L_2$-norms of the rows of $g_{tot}$.

9. The method as recited in claim 1, further including:
    g) acquiring, with the MRI system, image data from a subject in response to the produced RF excitation field; and
    h) reconstructing an image of the subject using the acquired image data.

10. A computer readable storage medium having stored thereon a computer program that when executed by a computer processor causes the processor to:
    a) determine a desired pattern of RF excitation;
    b) calculate, using the desired pattern of RF excitation:
        i) a plurality of weighting factors related to an RF waveform; and
        ii) a plurality of k-space locations related to a magnetic field gradient waveform;
    c) calculate, using the plurality of calculated k-space locations the magnetic field gradient waveform; and
    d) calculate, using the plurality of calculated weighting factors, the RF pulse waveform that will produce the desired pattern of RF excitation when produced, by a magnetic resonance imaging (MRI) system, substantially contemporaneously with the calculated magnetic field gradient.

11. The computer readable storage medium as recited in claim 10 in which the plurality of k-space locations and the plurality of weighting factors are jointly calculated.

12. The computer readable storage medium as recited in claim 11 in which step b) is performed by minimizing an objective function having the form:

$$f_1(\|d - SF_{tot}g_{tot}\|) + f_2(\|g^{(m)}\|);$$

wherein:
    $f_1$ and $f_2$ are non-decreasing functions;
    $\|\ldots\|$ is a norm operation;

d is the desired pattern RF excitation;

S is a sensitivity profile of a RF coil that makes a part of the MRI system;

$F_{tot}$ is a matrix that relates the energy deposited at a k-space location to a corresponding spatial location on the RF coil;

$g_{tot}$ is a matrix containing the plurality of weighting factors indicative of the sparse set of k-space locations; and $g^{(m)}$ is a vector having values equal to the $L_m$-norms of the rows of $g_{tot}$.

13. The computer readable storage medium as recited in claim 11 in which step b) is performed by minimizing an objective function having the form:

$$(1-\lambda)\|d - SF_{tot}g_{tot}\|_2^2 + \lambda\|g^{(l2)}\|_1;$$

wherein:

$\lambda$ is a control parameter;

$\|\ldots\|$ is a norm operation;

d is the desired pattern RF excitation;

S is a sensitivity profile of a RF coil that makes a part of the MRI system;

$F_{tot}$ is a matrix that relates the energy deposited at a k-space location to a corresponding spatial location on the RF coil;

$g_{tot}$ is a matrix containing the plurality of weighting factors indicative of the sparse set of k-space locations; and $g^{(l2)}$ is a vector having values equal to the $L_2$-norms of the rows of $g_{tot}$.

14. The computer readable storage medium as recited in claim 10 in which the computer program further causes the processor, when performing step b), to enforce joint sparsity in the plurality of k-space locations and the plurality of weighting factors.

15. The computer readable storage medium as recited in claim 10 in which the computer program further causes the processor to:

e) produce, with the MRI system, a magnetic field gradient using the calculated magnetic field gradient waveform; and f) produce, with the MRI system, an RF pulse using the calculated RF pulse waveform.

16. The computer readable storage medium as recited in claim 15 in which steps e) and f) are performed substantially contemporaneously so that an RF excitation field indicative of the desired pattern of RF excitation is produced.

17. The computer readable storage medium as recited in claim 10 in which the MRI system includes a parallel transmission RF coil.

18. The computer readable storage medium as recited in claim 17 in which step d) includes calculating an RF waveform for each channel in the parallel transmission RF coil.

19. A method for producing a radiofrequency (RF) excitation field with an RF coil that forms a part of a magnetic resonance imaging (MRI) system, the steps comprising:

a) determining a desired pattern of RF excitation;

b) determining a k-space trajectory from a set of candidate k-space trajectory segments by enforcing sparsity on the set of candidate segments;

c) calculating, using the desired pattern of RF excitation, an RF pulse waveform capable of forming a high-fidelity version of the desired RF excitation pattern, wherein the RF pulse waveform is calculated substantially concurrently with the determination of the k-space trajectory in step b); and d) producing, with the MRI system, an RF excitation pulse by transmitting the calculated RF pulse waveform along the determined k-space trajectory such that an RF excitation field is produced by the RF coil.

20. The method as recited in claim 19 in which step b) includes minimizing an objective function that substantially concurrently determines:

a plurality of k-space locations at which RF energy is to be deposited;

a plurality of weighting factors indicative of how much RF energy is to be deposited at the plurality of k-space locations; and wherein the plurality of k-space locations are determined using a sparsity enforcement algorithm.

* * * * *